United States Patent
Mandrekar et al.

(10) Patent No.: US 6,433,314 B1
(45) Date of Patent: *Aug. 13, 2002

(54) DIRECT TEMPERATURE CONTROL FOR A COMPONENT OF A SUBSTRATE PROCESSING CHAMBER

(75) Inventors: Tushar Mandrekar, Santa Clara; Anish Tolia, San Jose; Nitin Khurana, Milpitas, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/632,721

(22) Filed: Aug. 4, 2000

Related U.S. Application Data

(63) Continuation-in-part of application No. 09/052,254, filed on Apr. 8, 1998.

(51) Int. Cl.[7] .................................................. F27B 5/14
(52) U.S. Cl. ................. 219/390; 118/723 E; 118/723 I; 118/715; 219/405; 219/411; 392/416; 392/418
(58) Field of Search ................................ 219/399, 390, 219/405, 411; 118/724, 725, 501, 728, 715, 723 E, 723 ME, 723 I; 392/416, 418

(56) References Cited

U.S. PATENT DOCUMENTS

| | | | |
|---|---|---|---|
| 5,074,456 A | 12/1991 | Degner et al. | 228/121 |
| 5,155,336 A | 10/1992 | Gronet et al. | 219/411 |
| 5,200,232 A | 4/1993 | Tappan et al. | 427/569 |
| 5,275,977 A | 1/1994 | Otsubo et al. | 437/235 |
| 5,344,492 A | 9/1994 | Sato et al. | 118/725 |
| 5,357,715 A | 10/1994 | Hiramatsu | 451/357 |
| 5,445,709 A | 8/1995 | Kojima et al. | 216/71 |
| 5,584,971 A | 12/1996 | Komino | 204/192.13 |
| 5,595,606 A | 1/1997 | Fujikawa et al. | 118/725 |
| 5,653,806 A | 8/1997 | Van Buskirk | 118/715 |

(List continued on next page.)

FOREIGN PATENT DOCUMENTS

| | | | |
|---|---|---|---|
| EP | 0 441 710 | 8/1991 | G05D/23/19 |
| EP | 0 477 453 | 4/1992 | G01R/31/28 |
| EP | 0 714 998 | 6/1996 | C23C/16/44 |
| EP | 0 776 988 | 6/1997 | C23C/14/50 |
| JP | 07-326587 | 12/1995 | |
| JP | 08-187212 | 7/1996 | |

OTHER PUBLICATIONS

U.S. application No. 08/238,598, Sahin et al., filed Jan. 17, 1992.

U.S. application No. 09/030,264, Fu et al., filed Feb. 25, 1998.

PCT International Search Report from PCT/US 01/24175, Dated Mar. 20, 2002.

*Primary Examiner*—Teresa Walberg
*Assistant Examiner*—Shawntina T. Fuqua
(74) *Attorney, Agent, or Firm*—Moser, Patterson & Sheridan, LLP

(57) ABSTRACT

An apparatus and a method of regulating temperature of a component of a processing chamber is provided. The apparatus comprises a first thermal conductor thermally connected to the component, wherein the first thermal conductor is a resistive heating element disposed adjacent the component, a second thermal conductor thermally connected to the component, wherein the second thermal conductor is a fluid channel disposed adjacent the component, the fluid channel having a fluid inlet and a fluid outlet, a controller connected to the first and second thermal conductors, providing at least one temperature sensor connected to the component to supply temperature readings to the controller. Radiative heaters in thermal communication with the component may be used in place of a resistive heating element.

32 Claims, 10 Drawing Sheets

U.S. PATENT DOCUMENTS

| | | | |
|---|---|---|---|
| 5,665,166 A | 9/1997 | Deguchi et al. | 118/723 E |
| 5,766,364 A | 6/1998 | Ishida et al. | 118/725 |
| 5,781,693 A * | 7/1998 | Balance et al. | 392/416 |
| 5,835,334 A | 11/1998 | McMillin et al. | 361/234 |
| 5,846,375 A | 12/1998 | Gilchrist et al. | 156/345 |
| 5,953,827 A | 9/1999 | Or et al. | 34/58 |
| 6,035,101 A | 3/2000 | Sajoto et al. | 392/416 |
| 6,072,163 A * | 6/2000 | Armstrong et al. | 219/497 |
| 6,091,060 A * | 7/2000 | Getchel | 219/483 |
| 6,117,245 A * | 9/2000 | Mandrekar et al. | 118/724 |
| 6,176,198 B1 * | 1/2001 | Kao et al. | 118/723 ME |
| 6,286,451 B1 * | 9/2001 | Ishikawa et al. | 118/723 I |

* cited by examiner

DIRECT TEMPERATURE CONTROL FOR A COMPONENT OF A SUBSTRATE PROCESSING CHAMBER

This application is a continuation-in-part which claims priority to co-pending U.S. patent application Ser. No. 09/057,254, entitled 'Method and Apparatus For Controlling and Heating Fluids For A Gas Distribution Plate' and filed on Apr. 8, 1998.

BACKGROUND OF THE INVENTION

1. Field of the Invention

The present invention generally relates to substrate processing chambers. More particularly, the present invention relates to controlling the temperature of a component of a substrate processing chamber.

2. Background of the Related Art

In the fabrication of integrated circuits, vacuum process chambers are generally employed to deposit films on semiconductor substrates. The processes carried out in the vacuum chambers typically provide the deposition or etching of multiple metal, dielectric and semiconductor film layers on the surface of a substrate. Examples of such processes include chemical vapor deposition (CVD), physical vapor deposition (PVD), and etching processes. For CVD, a variety of gases are introduced into the process chamber and act as reactants which deposit material on the substrate surface. A uniform distribution of gas concentration within the processing chamber is highly desirable to ensure a uniform progression of the process because variations in the gas concentration within the process chamber produce non-uniform deposition across the substrate surface resulting in a non-planar topography which can lead to reduced yield and device failure.

Gas distribution plates are commonly utilized in CVD chambers to uniformly introduce processing gas into the processing chamber. A typical gas distribution plate comprises a showerhead disposed at the top portion of the chamber or as part of the chamber lid. Generally, a process gas inlet is connected to the gas distribution plate to supply the processing gas thereto. The processing gas passes through the gas distribution plate into the processing chamber. The deposition reaction of the processing gas is typically temperature dependent. Thus, the temperature of the gas distribution plate must be maintained at a temperature at which reaction will not take place therewith.

If deposition occurs on the showerhead, it may clog the showerhead holes and disturb the process gas distribution into the chamber, causing uneven processing on the substrate surface, or particulates of the deposition material can flake off from the showerhead and drop onto the substrate surface, rendering the substrate useless. Furthermore, improper temperature of the gas delivery system may cause condensation of the process gas within the gas delivery system, and reduce the amount of process gas reaching the process chamber and resulting in inadequate deposition.

In addition to affecting the delivery of process gas to the chamber, the gas distribution plate temperature also affects the substrate temperature, and thus, the deposited film properties, because of the close spacing between the substrate and the chamber lid/gas distribution plate. Typically, because of the low pressures present in CVD processing, the emmisivity of the gas distribution plate is the primary contributor affecting the substrate temperature. Although the substrate temperature is "controlled" by controlling the temperature of the substrate support, film properties such as resistance ($R_s$) uniformity and deposition thickness uniformity can be influenced by variations in the substrate temperature caused by showerhead temperature variations.

Currently, "BCS" or Burn-in/Conditioning/Seasoning is the process employed to control the lid/showerhead temperature. Generally, BCS comprises running the plasma process on one or more wafers until the lid and the gas distribution plate reach a steady state processing temperature (when the chamber is burned-in/conditioned/seasoned) while depositing the material throughout the chamber. Typically, the lid and the gas distribution plate are heated gradually by the plasma generated within the chamber during processing until a desired processing temperature is reached and maintained by a balance of heat provided by the plasma less the heat transferred from these components. Alternatively, an active heating element, such as a resistive heater, can be attached to the lid to speed up the heating process to steady state temperatures. Processing at a steady state temperature is desirable because predictable reactions and deposition occur during steady state conditions.

One particular drawback of the BCS method is the "first wafer effect" in which the first few wafers are rendered useless because of temperature inconsistencies which lead to non-uniform processing results between wafers. During the BCS process, the lid and gas distribution plate temperatures are ramped up to the steady state temperature from a cold start or room temperature by the plasma generated in the chamber. Because substrate processing is generally temperature dependent, the temperature variations during the BCS process cause variations in the deposition rate and other reactions on the first few wafers. The inconsistent properties of the film deposited on the first few wafers, as compared to those processed during steady state conditions, renders the first few wafers useless. Temperature variations during processing of different wafers may also cause inconsistent deposition or processing between different wafers of a process run, resulting in undesirable, inconsistent film properties. Also, the BCS process typically is very time consuming and reduces the output because of the preliminary wafers sacrificed in the BCS process.

Undesirable process gas reactions may also occur at the gas distribution plate when the gas distribution plate is heated to too high a temperature by the plasma generated in the chamber. Typically, CVD process gases breakdown at high temperatures, resulting in reduced deposition rate. One attempt to prevent unwanted reaction due to high temperature at the gas distribution plate provides a liquid coolant passage surrounding the showerhead to cool the showerhead by thermal conduction/convection. FIG. 1 is an exploded perspective view of a gas distribution plate having a liquid coolant passage. The gas distribution plate 120 comprises a base 180 and a liquid passage cover 182. The gas distribution plate 120 is a dish-shaped device made of thermal conductive material having a circular, centrally disposed cavity 150 defined by the side wall 152 and a bottom plate 154. A plurality of gas distribution holes 156 disposed on the bottom plate 154 provide the process gas passage into the processing chamber. A beveled lower wall portion 158 joins the side wall 152 with the bottom plate 154. A flange portion 160 projects outwardly in a horizontal plane to form the upper portion of the gas distribution plate 120 and serves to provide engagement of the gas distribution plate 120 with the base plate of the chamber lid. Fasteners such as bolts or screws secure the plate 120 with the base plate of the chamber lid through a plurality of engagement holes 162. A gas injection plate depression 130 is formed in the upper surface of the flange portion 160 to facilitate the mounting of a gas injection cover plate onto the gas distribution plate 120.

The base 180 includes a liquid coolant passage 173 machined or cut out of the base 180 and surrounds the side wall 152. The liquid passage cover 182 is secured and sealed to the base 180 by fasteners or by welding to form the upper wall of the liquid coolant passage 173. The liquid passage cover 182 includes an inlet 170 and an outlet 174, projecting upwardly from the liquid passage cover 182 and having bores 172 and 176 formed therethrough. The liquid coolant passage 173 is not formed as a complete annular passage. A blockage portion 204 is positioned between the inlet portion 206 and the outlet portion 208 of the liquid coolant passage 173 to prevent the liquid coolant from travelling the short arc distance between the inlet portion 206 and the outlet portion 208. Instead, the liquid coolant enters the liquid coolant passage 173 through the inlet portion 206, travels completely around the side wall 152, and exits the channel 186 through the outlet portion 208.

In operation, the liquid coolant is pumped from a liquid coolant supply (not shown) to the inlet 170 on the gas distribution plate 120. Usually, the liquid coolant supply includes a chiller or refrigeration unit that cools the liquid coolant to a particular temperature. Once the liquid coolant enters the gas distribution plate 120, the liquid coolant circulates through the liquid coolant passage 173 to cool the gas distribution plate 120 and exits the gas distribution plate 120 through the outlet 174. The liquid coolant then returns to the liquid coolant supply and is re-circulated through the system. By providing a liquid coolant at a much lower temperature than the processing gas, the liquid coolant can prevent the lid, and thus, the processing gas flowing therethrough, from heating to an undesired level. However, this apparatus is still susceptible to overheating of the lid and the gas distribution plate as the liquid coolant becomes heated and loses its cooling properties because of re-circulation through the system. Furthermore, this apparatus is limited to cooling the lid temperature below at selected temperature and is not capable of controlling the lid temperature to respond and adjust quickly to temperature fluctuations in the lid and showerhead.

The major drawback of the both the BCS and the coolant techniques is the lack of active regulation of the temperature of lid and the gas distribution plate. To maintain the steady state processing temperature, the BCS process relies on passive heating by the plasma generated in the chamber while the liquid coolant apparatus relies on cooling of the gas distribution plate by the liquid coolant. For both of these techniques, the lid and the gas distribution plate still may reach undesirable temperatures during processing. Furthermore, both of these techniques are unable to respond to and actively control temperature fluctuations in the lid and the distribution plate.

Therefore, there remains a need for an apparatus and a method of regulating the temperature of the lid to the chamber and the associated processing gas distributor or showerhead to provide consistent wafer processing and eliminate first wafer effects. Particularly, there is a need for an apparatus and a method for controlling substrate resistance uniformity and deposition uniformity. There is also a need for a temperature control system which responds quickly to temperature fluctuations in the lid and showerhead.

SUMMARY OF THE INVENTION

The invention generally provides an apparatus and a method of regulating the temperature of a component of a substrate processing chamber to provide consistent substrate processing and eliminate first substrate effects. The invention also provides a temperature control system that responds quickly to temperature fluctuations in the component.

In one aspect, the invention provides an apparatus for regulating temperature of a component of a processing system, such as a gas distribution system including a chamber lid and a gas distribution plate, comprising a thermal conductor thermally connected to the component, a controller connected to the thermal conductor to regulate heat transfer between the component and the thermal conductor and at least one temperature sensor connected to the component to supply temperature readings to the controller.

The invention also provides a method of regulating temperature of a component of a processing chamber comprising: providing a thermal conductor thermally connected to the component, providing a controller connected to the thermal conductor, providing at least one temperature sensor connected to the component to supply temperature readings to the controller and regulating heat transfer between the component and the thermal conductor by changing the temperature of the thermal conductor.

In another aspect, the invention provides a thermal conductor comprising a fluid channel disposed adjacent the component, the fluid channel having a fluid inlet and a fluid outlet, and a cooling fluid supply and a heating fluid supply connected to the fluid inlet. Preferably, a controller regulates proportionately the cooling fluid supply and the heating fluid supply into the fluid inlet to change the thermal conduction between the thermal conductor and the component. Alternatively, the controller provides on/off switching of the cooling fluid supply and the heating fluid supply into the fluid inlet to change the heat transfer between the thermal conductor and the component.

Yet another aspect of the invention provides an apparatus and a method for providing a temperature gradient in a component of a processing chamber such as a chamber lid. Preferably, the temperature gradient raises the temperature about a peripheral portion of the substrate to provide a uniform temperature across a substrate in the chamber, resulting in a uniform deposition thickness and a uniform substrate resistance. The apparatus for providing a temperature gradient in a component of a processing chamber comprises a first thermal conductor at a first temperature attached to the component and a second thermal conductor at a second temperature attached to the component.

In another aspect, the invention provides an apparatus for regulating temperature of a component of a processing system, such as a gas distribution system including a chamber lid and a gas distribution plate, comprising a first thermal conductor thermally connected to the component, wherein the first thermal conductor is a resistive heating element disposed adjacent the component, a second thermal conductor thermally connected to the component, wherein the second thermal conductor is a fluid channel disposed adjacent the component, the fluid channel having a fluid inlet and a fluid outlet, a controller connected to the first and second thermal conductors to regulate heat transfer between the component and the first and second thermal conductors and at least one temperature sensor connected to the component to supply temperature readings to the controller.

The invention also provides a method of regulating temperature of a component of a processing chamber comprising providing a first thermal conductor thermally connected to the component, wherein the first thermal conductor is a resistive heating element disposed adjacent the component, providing a second thermal conductor thermally connected to the component, wherein the second thermal conductor is a fluid channel disposed adjacent the component, the fluid channel having a fluid inlet and a fluid outlet, providing a controller connected to the first and second thermal conductor, providing at least one temperature sensor connected to the component to supply temperature readings to the controller, and regulating heat transfer between the component and the first and second thermal conductor by changing the temperature of the first and second thermal conductor.

In another aspect, the invention provides an apparatus for regulating temperature of a component of a processing system, such as a gas distribution system including a chamber lid and a gas distribution plate, comprising a first thermal conductor attached to the component, wherein the first thermal conductor is a radiative heating element disposed adjacent the component, a second thermal conductor thermally connected to the component, wherein the second thermal conductor is a fluid channel disposed adjacent the component, the fluid channel having a fluid inlet and a fluid outlet, a controller connected to the first and second thermal conductors to regulate heat transfer between the component and the first and second thermal conductors, and at least one temperature sensor connected to the component to supply temperature readings to the controller.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
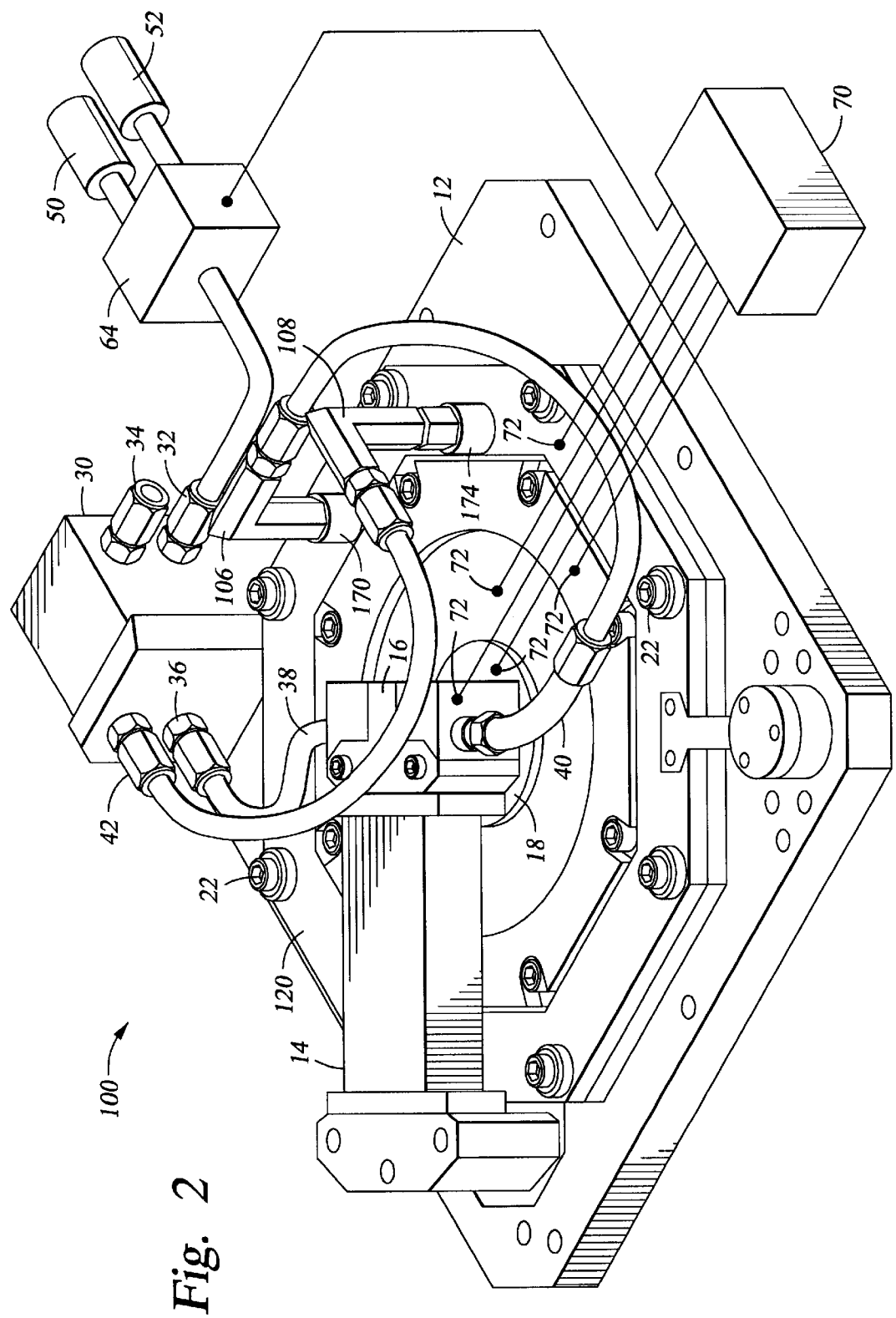
FIG. 2 is a perspective view of a CVD chamber lid having a temperature control system of the invention.

FIG. 2 is a perspective view of a CVD chamber lid having a temperature control system of the invention. The lid 100 generally includes a base plate 12, a process gas injection manifold 14 and a gas distribution plate 120 secured therebetween. The base plate 12 is preferably releasably secured to the top portion of the CVD chamber (not shown) and seals the processing environment during processing.

Figure 1:
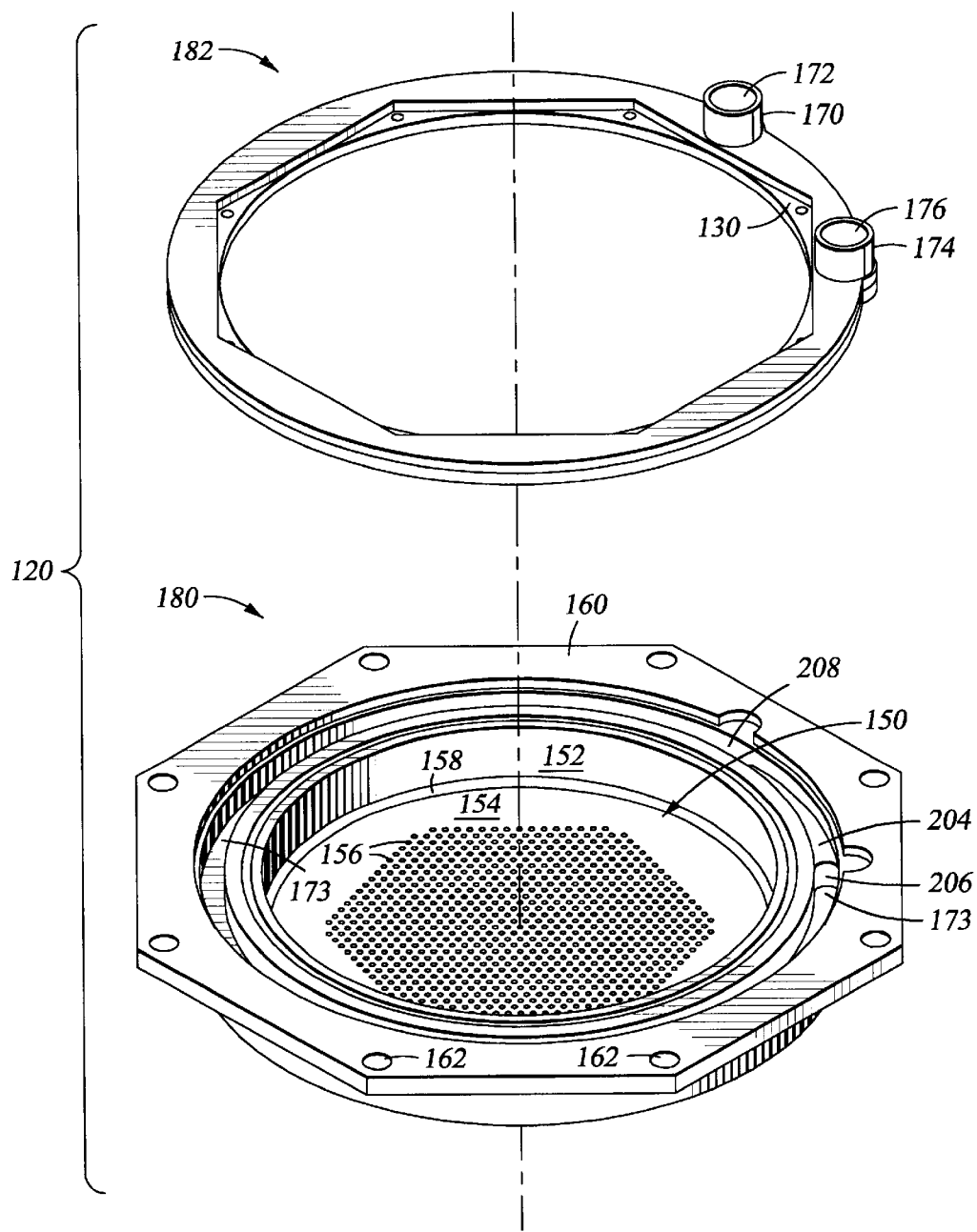
FIG. 1 is an exploded perspective view of a gas distribution plate having a liquid coolant passage.

Referring to both FIG. 1 and FIG. 2, the gas distribution plate 120 is secured and sealed to the base plate 12 by fasteners 22 and generally includes a thermal fluid passage cover 182 and a base 180 having a thermal fluid passage 173. The thermal fluid passage cover 182 includes a thermal fluid inlet 170 forming the inlet of the thermal fluid passage 173 and a thermal fluid outlet 174 forming the outlet of the thermal fluid passage 173. The base 180 includes a cavity 150 defined by side wall 152 and bottom plate 154 which includes a plurality of gas distribution holes 156 to provide process gas passages into the processing chamber. The thermal fluid passage 173 preferably completely surrounds the side wall 152 to provide conductive thermal exchanges of heat between the lid/showerhead and the thermal fluid. A separation block 204 is positioned in the short arc portion between the inlet portion 206 and the outlet portion 208 to prevent the incoming fresh thermal fluid supply from mixing with the outgoing thermal fluid that has circulated through the thermal fluid passage 173. The thermal fluid passage cover 182 is secured by fasteners, such as screws or bolts, to the base 180 to form the gas distribution plate 120 and to provide a sealed thermal fluid channel 173 except for the thermal fluid inlet 170 and the thermal fluid outlet 174.

The gas distribution plate 120 is secured by fasteners on the base plate 12, and a gas injection cover plate 18 is secured on top of the gas distribution plate 120. A process gas injection manifold 14 is connected to a process gas supply (not shown) and secured onto the base plate 12. The process gas manifold 14 includes a gas injection manifold head 16 attached to the gas injection cover plate 18. The gas injection manifold head 16 injects the process gas through the gas injection cover plate 18, and the gas injection manifold head 16 includes a head thermal fluid passage (not shown) connected to a fluid inlet 38 and a fluid outlet 40. The head thermal fluid passage is disposed within the gas injection manifold head 16 similarly to the thermal fluid passage in the gas distribution plate 120 to provide thermal conduction between the thermal fluid and the gas injection manifold head 16. The head thermal fluid passage allows the temperature of the gas injection manifold head 16 to be regulated.

A thermal fluid manifold 30, mounted on the lid base plate 12, includes a thermal fluid supply inlet 32, an exhaust port 34 connected to a thermal fluid exhaust (not shown), a thermal fluid supply outlet 36 connected to the fluid inlet 38 on the gas injection manifold head 16, and a manifold return 42 connected through connector 108 to the thermal fluid outlet 174 on the gas distribution plate 120. Generally, flexible rubber hose or other fluid conduits can be used to connect various thermal fluid inlets and outlets. The gas injection manifold head 16 includes a fluid inlet 38 connected to the manifold supply outlet 36 and a fluid outlet 40 connected through connector 106 to the thermal fluid inlet fitting 170 on the gas distribution plate 120. In operation, the thermal fluid travels from the thermal fluid manifold 30 to the gas injection manifold head 16, then to the gas distribution plate 120. The thermal fluid circulates through the thermal fluid passage within the gas injection manifold head 16 to control the temperature of the gas injection manifold head 16, and once the thermal fluid reaches the gas distribution plate 120, the thermal fluid circulates through the thermal fluid passage 173 to control the temperature of the gas distribution plate 120. The thermal fluid then exits the gas distribution plate 120 through the thermal fluid outlet 174 and returns to the thermal fluid manifold 30. Then the thermal fluid is pumped out of the system through exhaust port 34 to the thermal fluid exhaust.

A thermal fluid supply is connected to the thermal fluid supply inlet 32 on the thermal fluid manifold 30. The thermal fluid supply preferable comprises a cooling fluid supply 50 and a heating fluid supply 52 to provide a cooling fluid and a heating fluid, respectively, to change the temperature of the thermal fluid according to the desired temperature regulation. The cooling fluid supply 50 is connected to the thermal fluid supply inlet 32 through a control valve 64 and supplies a cooling fluid at a known temperature ($T_c$) lower than the desired processing temperature ($T_o$). The heating fluid supply 52 is also connected to the thermal fluid supply inlet 32 through the control valve 64 and supplies a heating fluid at a known temperature ($T_h$) higher than the desired processing temperature ($T_o$). The control valve 64 is preferably a proportional integral and differential (PID) control valve 64 connected to and controlled by a controller 70 as shown in FIG. 2. Preferably, both the cooling fluid supply 50 and the heating fluid supply 52 provide the respective fluids at known temperatures at the same fluid pressure to the control valve 64 so that the temperature of the thermal fluid mixture resulting from the control valve 64 is dependent only the proportion of heating/cooling fluids. Alternatively, a temperature sensor (not shown) can be positioned within or near the control valve 64 to measure the temperature of the thermal fluid mixture, and the controller 70 can adjust the proportion of the heating/cooling fluids correspondingly to ensure that the thermal fluid is at the desired temperature.

Figure 3A:
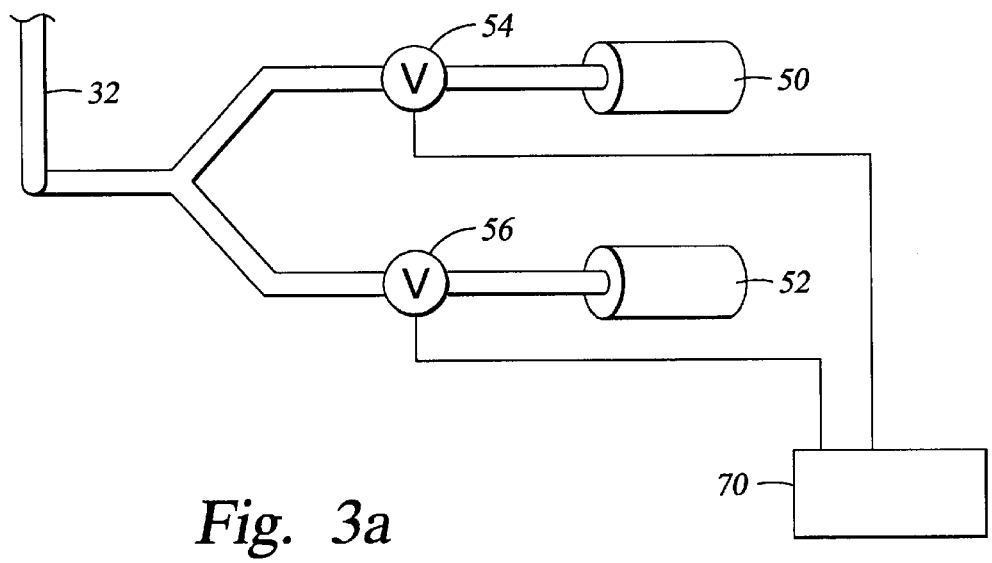
FIGS. 3a and 3b are schematic partial illustrations of alternative embodiments of the invention.
Figure 3B:
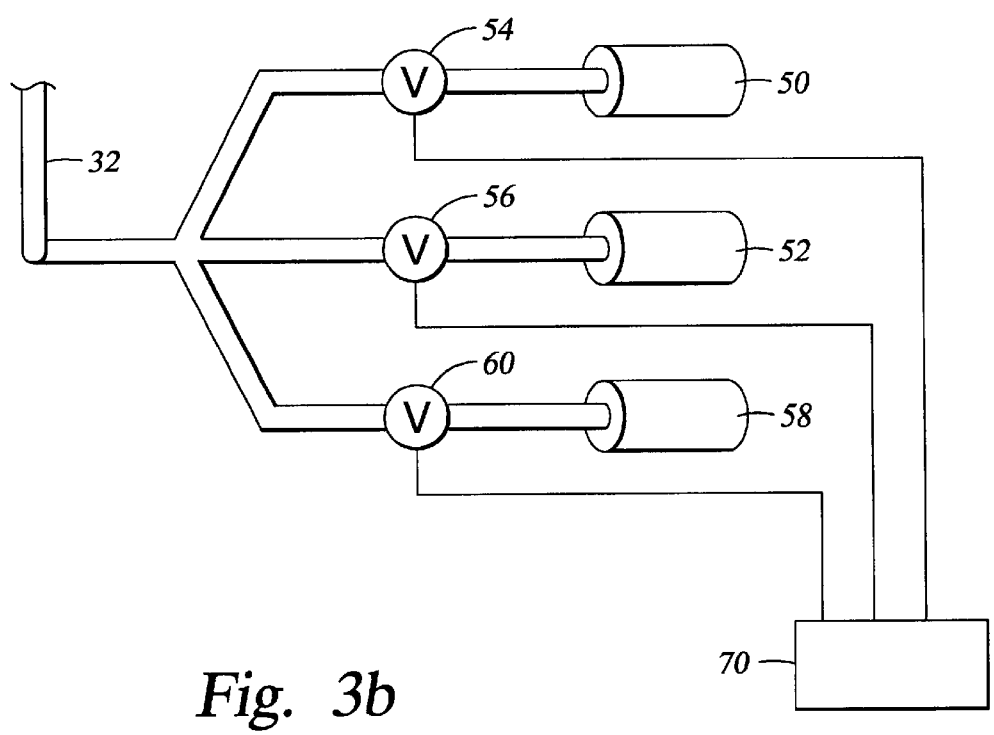

Alternatively, as shown in FIG. 3a, the cooling fluid supply 50 and heating fluid supply 52 can be controlled by separate PID valves 54, 56 or on/off switching valves, instead of a single unit PID valve. Each of the control valves 54, 56 are connected to and controlled by the controller 70. FIG. 3b shows another alternative embodiment which provides a third fluid supply 58 controlled by control valve 60 connected to the thermal fluid supply inlet 32 to supply a fluid at the desired processing temperature ($T_o$) while the cooling fluid supply 50 and the heating fluid supply 52 are regulated by control valves 54, 56. Each of the control valves 54, 56, 60 are connected to and controlled by the controller 70.

A temperature controller 70, preferably a microprocessor control, adjusts the proportional amount of cooling and heating fluids to change the temperature of the thermal fluid circulating in the gas injection manifold head 16 and the gas distribution plate 120 to control the temperature of the gas injection manifold head 16 and the gas distribution plate 120. A plurality of temperature sensors or thermocouples 72 are selectively positioned on the lid 100 and the gas distribution plate 120 to provide temperature readings to the controller 70. The controller 70 then determines whether the measured temperatures are within an acceptable deviation from the desired process temperature ($T_o$). If the measured temperatures are within the acceptable deviations, the controller 70 maintains the same thermal fluid flow from the cooling fluid and the heating fluid. If the measured temperatures are outside of the acceptable deviations, the controller 70 changes the temperature of the thermal fluid by varying the proportional amount of the cooling and heating fluid to either cool or heat the gas injection manifold head 16 and the gas distribution plate 120. Preferably, the temperature of the gas distribution plate 120 is continuously monitored to provide instantaneous feedback of temperature changes so that the controller 70 can instantly change the temperature of the thermal fluid accordingly. Alternatively, the temperature can be monitored periodically in short intervals.

Preferably, the temperature controller 70 is a microprocessor or computer controller that senses the temperatures from various temperature sensors 72 and changes the temperature of the thermal fluid accordingly. Even more preferably, because heat transfer is a function of the flow rate of the thermal fluid and the temperature differential between the temperature of the thermal fluid and the temperature of the lid and/or gas distribution plate, the controller 70 is connected to a thermal fluid pump (not shown) to change the pressure of the thermal fluids and the flow rate of the thermal fluid flowing through the lid 100 and the gas distribution plate 120 to control the heat transfer. Generally, the greater the flow rate or the temperature differential, the greater the heat transfer between the thermal fluid and the lid and/or gas distribution plate.

Figure 4:
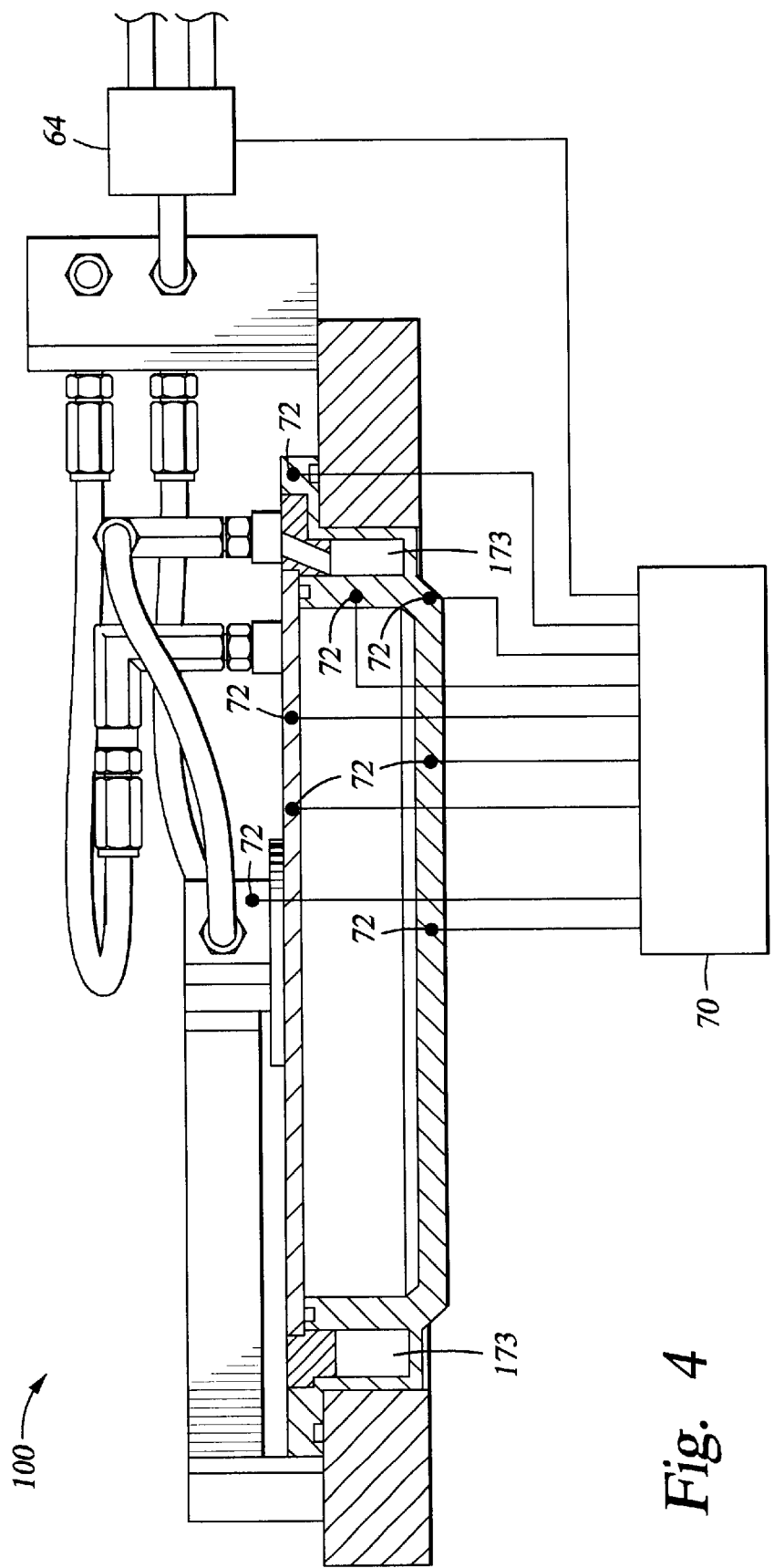
FIG. 4 is a cross sectional view of a CVD chamber lid having a temperature control system of the invention.

FIG. 4 is a cross sectional view of a CVD chamber lid 100 having a temperature control system of the invention showing an array of temperature sensors 72 positioned at various locations within the lid 100. An accurate lid temperature assessment can be made because the distribution of the temperature sensors 72 throughout the lid 100 provides a wider sample of temperature measurements. Preferably, the temperature sensors are spread out throughout the lid and disposed at different vertical and horizontal positions. The arrangement of the temperature sensors 72 at different levels/locations of the lid 100 also provides temperature readings at critical locations such as the showerhead or gas distribution plate. Thus, the controller 70 can respond quickly to temperature fluctuations at the critical locations to immediately remedy the problems as they arise by immediately changing the temperature and/or the flow rate of the thermal fluid flowing therethrough. The controller can also selectively measure the temperatures of the lid 100 according to the requirement of the specific processing criteria and control the thermal fluid accordingly.

To change the temperature of the thermal fluid, the controller 70 changes the proportion of the cooling fluid and the heating fluid supplied to the thermal fluid manifold inlet 32. In one preferred embodiment, the cooling fluid supply 50 and the heating fluid supply 52 are connected to a proportional control (PID) control valve 64 which regulates the proportion of the heating fluid and the cooling fluid supplied. In another embodiment, the cooling fluid supply 50 is maintained at a fixed flow while the heating fluid supply 52 is controlled by a PID control valve or an on/off switching valve. Alternatively, the heating fluid supply 52 is maintained at a fixed flow while the cooling fluid supply 50 is controlled by a PID control valve or an on/off switching valve. Yet another embodiment provides a third fluid supply 58 having thermal fluid at the desired or steady-state process temperature ($T_o$) connected to the thermal fluid manifold inlet 32. The flow of the third fluid supply at temperature $T_o$ is maintained at a fixed constant while the flow of the cooling fluid and the heating fluid is controlled by either a PID control valve or an on/off switching valve. The change in the temperature of the thermal fluid changes the temperature of the lid and the showerhead through thermal conduction.

The invention provides active regulation of the temperature of the lid/showerhead which responds quickly to variations in the processing temperatures. By regulating process temperatures of the lid/showerhead, uniformity of process results and consistent wafer processing can be achieved. Also, the temperature sensors 72 can be placed in various arrangements to accommodate various processes, and the controller 70 may regulate the flow of the thermal fluids accordingly.

Figure 5:
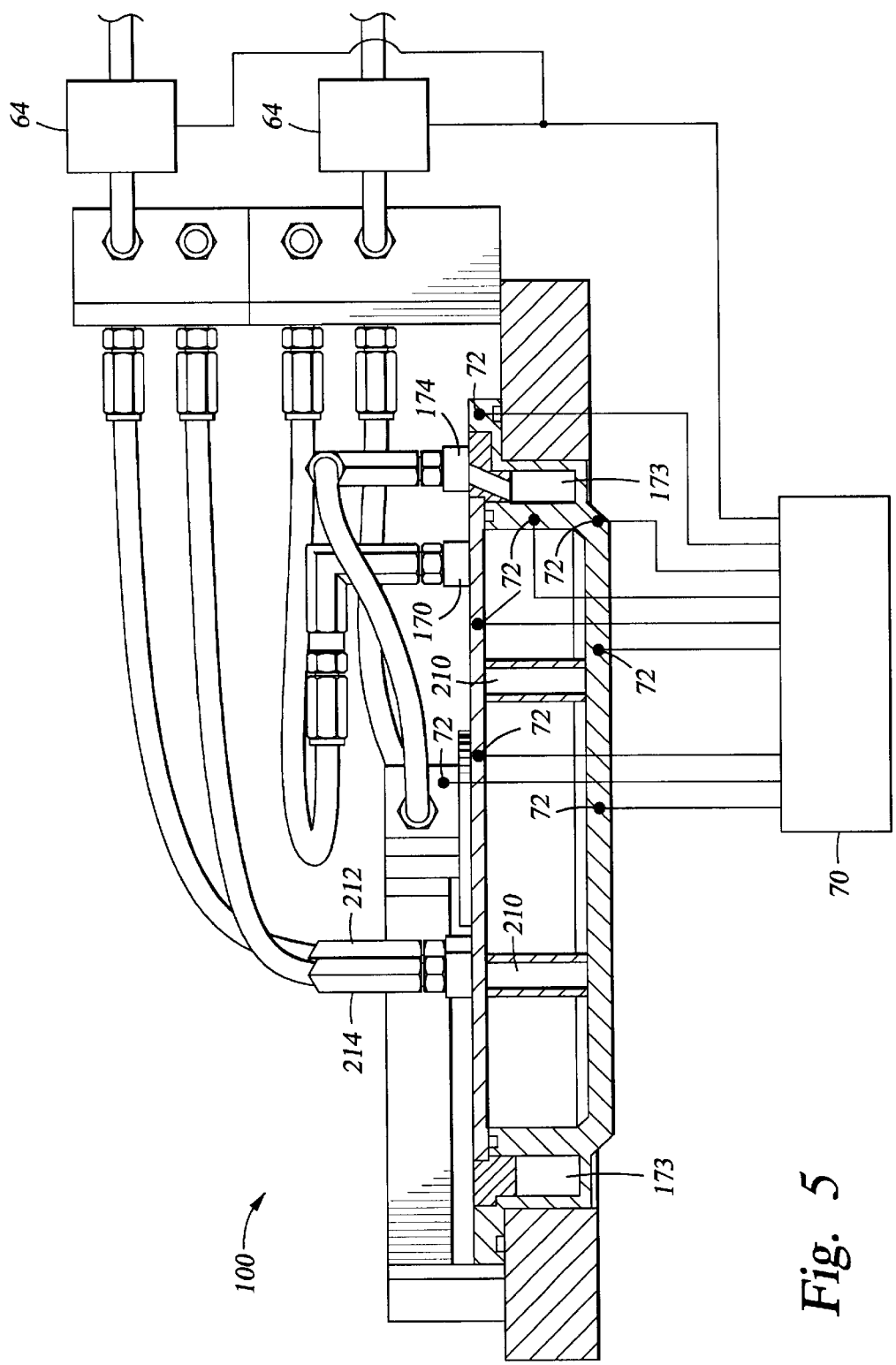
FIG. 5 is a cross sectional view of an alternative embodiment of the invention having two concentric thermal fluid passages disposed in the chamber lid.

FIG. 5 is a cross sectional view of another embodiment of the invention that includes two separate thermal fluid passages disposed concentrically within the chamber lid. Preferably, an outer thermal fluid passage 173 is positioned directly above a peripheral portion of a substrate in a chamber while an inner thermal fluid passage 210 is positioned above a central portion of the substrate. The outer thermal fluid passage 173 is connected to a first thermal fluid supply at a first thermal fluid temperature through a first control valve 64. The first thermal fluid enters the outer thermal fluid passage 173 through a first inlet 170, circulates through the outer thermal fluid passage 173 and exits through a first outlet 174. The inner thermal fluid passage 210 is connected to a second thermal fluid supply at a second thermal fluid temperature through a second control valve 64. The second thermal fluid enters the inner thermal fluid passage 210 through a second inlet 212, circulates through the inner thermal fluid passage 210 and exits through a second outlet 214. The different temperatures of the thermal fluids in the outer and the inner thermal fluid passages 173 and 210 create a temperature gradient concentrically in the chamber lid 100. Because the temperature of the peripheral portion of the substrate is generally colder than the central portion of the substrate, the temperature of the first thermal fluid supply is generally higher than the temperature of the second thermal fluid supply to raise the temperature of the peripheral portion of the substrate and provide a uniform temperature across the substrate. The resulting uniform temperature across the substrate provides a uniform deposition thickness and a uniform substrate resistance across the substrate.

Alternatively, more than two thermal fluid passages are disposed within the chamber lid to provide more accurate substrate temperature control. Preferably, these thermal fluid passages are arranged concentrically to correspond to the temperature variations on the substrate. Generally, the temperatures of the thermal fluids in the outer passages are higher than the temperatures of the thermal fluids for the inner passages to equalize the temperatures across the substrate. A temperature gradient in the chamber lid is thus created by the different temperatures of the thermal fluids to equalize the temperature gradient across the substrate.

Another alternative for achieving a temperature gradient in the chamber lid is to control the flow of the thermal fluids into the passages by valves such as electronically controlled valves or PID valves 64. Generally, the valves 64 provide a higher flow of thermal fluids in the outer passages and a lower flow of thermal fluids in the inner passages to provide a temperature gradient in the chamber lid 100. Preferably, a plurality of temperature sensors 72 are disposed throughout the chamber lid 100 to provide temperature readings to a controller 70 that controls the valves 64 to adjust the flow of the thermal fluids in the thermal fluid passages 173 and 210. The controller 70 is then able to respond quickly and adjust the flow of the thermal fluids when sudden temperature variations occur.

Figure 6:
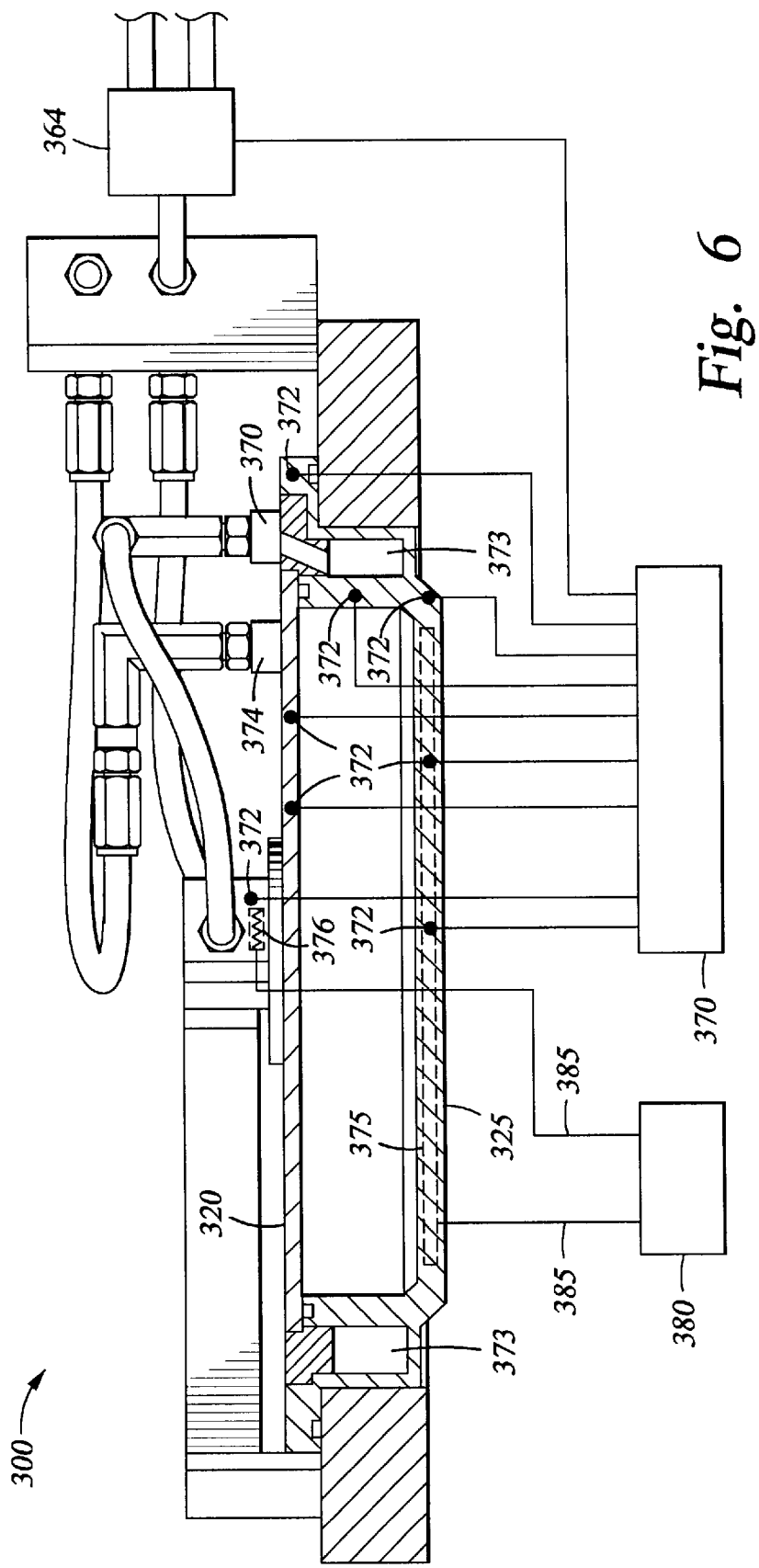
FIG. 6 is a cross sectional view of an alternative embodiment of the invention having at least one concentric thermal fluid passages and indicating placement of at least one resistive heating element disposed in the chamber lid.

FIG. 6 is a cross sectional view of another embodiment of the invention that includes a thermal fluid passage 373 disposed concentrically within the chamber lid 300 and at least one resistive heating element 375. The resistive heating element 375 is in thermal communication with the gas distribution plate 320, such as either embedded within or fastened to the gas distribution plate 320 and chamber lid 300. The resistive heating elements may be configured as concentric arrays, grid patterns, individual concentric lines, or a number of various configuration for heating of the gas distribution plate 320. The thermal fluid passage 373 is preferably positioned directly above a peripheral portion of a substrate in a chamber, and the at least one resistive heating element 375 is positioned across the face 325 of the gas distribution plate 320 and above a central portion of the substrate as shown in FIG. 6.

Each resistive heating element is independently connected and powered by a power supply 380. The power supply 380 delivers a controllable power level to the resistive heating elements which produces controllable temperatures. A power level between about 5 watts and about 2000 watts may be used to heat the gas distribution plate to a temperature between about 25° C. and about 300° C. A power level of between about 50 watts and about 100 watts is preferably used to heat the gas distribution plate to a temperature between about 50° C. and about 100° C. However, the exact power requirements will depend on type of resistive heater used and the configuration of resistive heating elements in the gas distribution plate.

The thermal fluid passage 373 is connected to a thermal fluid supply (not shown) at a thermal fluid temperature through a control valve 364. The thermal fluid enters the thermal fluid passage 373 through an inlet 370, circulates through the thermal fluid passage 373 and exits through an outlet 374. Alternatively, multiple thermal fluid passages may be disposed in the chamber lid 300, and may be independently connected to independent thermal fluid supplies. The temperature of the thermal fluid is controlled as described above.

A thermal gradient can be established in the chamber lid 300 by varying the temperature of the thermal fluid passage 373 and the temperature of the resistive heating elements 375. Power is supplied to the resistive heater to provide a first temperature, and thermal fluid at a second temperature is provided to the thermal fluid passage 373. By controlling the respective first and second temperatures, a thermal gradient can be applied to the gas distribution plate.

For example, the temperature of a peripheral portion of the substrate is generally colder than the central portion of the substrate, the second temperature of the thermal fluid supply is generally higher than the first temperature of the concentric resistive heating elements to raise the temperature of the peripheral portion of the substrate and provide a uniform temperature across the substrate. The resulting uniform temperature across the substrate provides a uniform deposition thickness and a uniform substrate resistance across the substrate.

Figure 7:
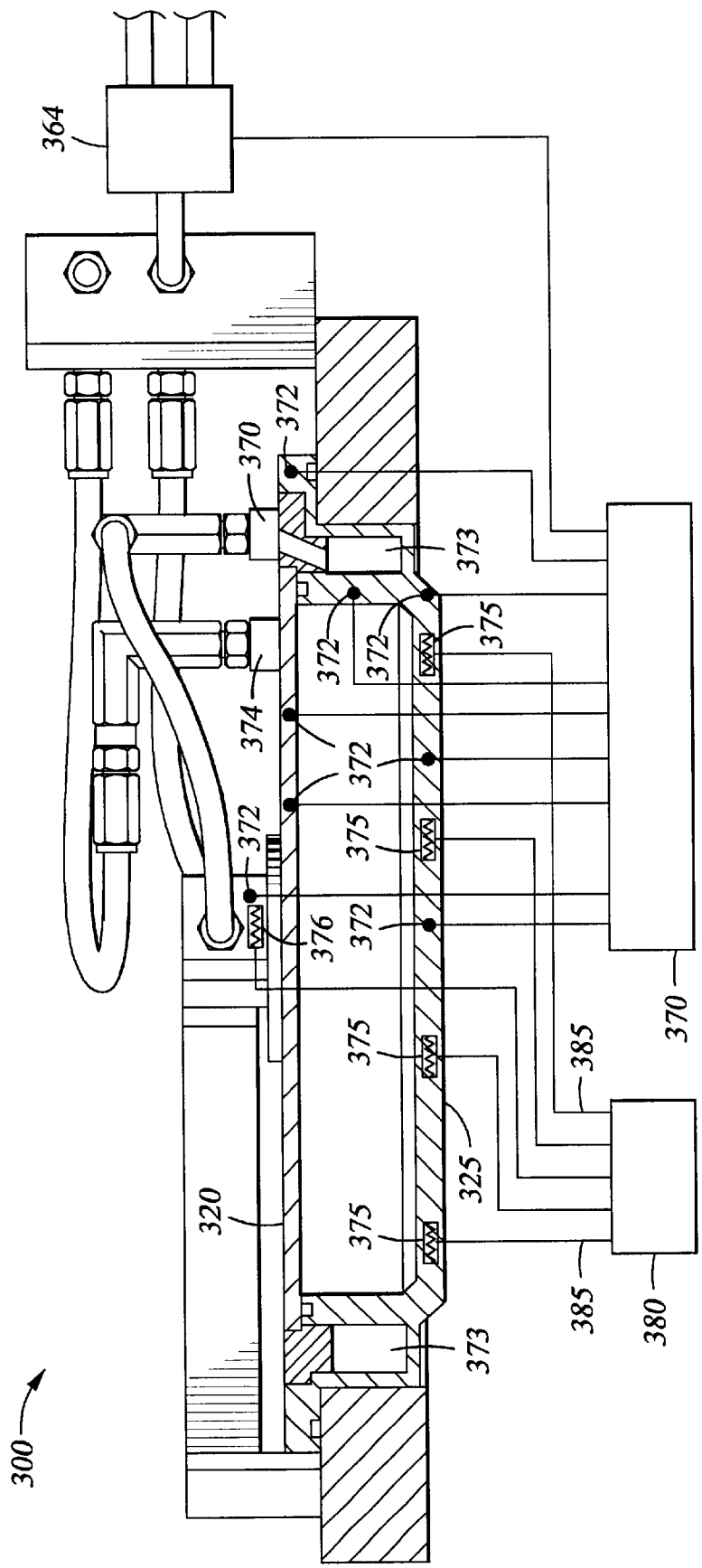
FIG. 7 is a cross sectional view of an alternative embodiment of the invention having at least one concentric thermal fluid passages and two concentric resistive heating elements disposed on the gas distribution plate.
Figure 8:
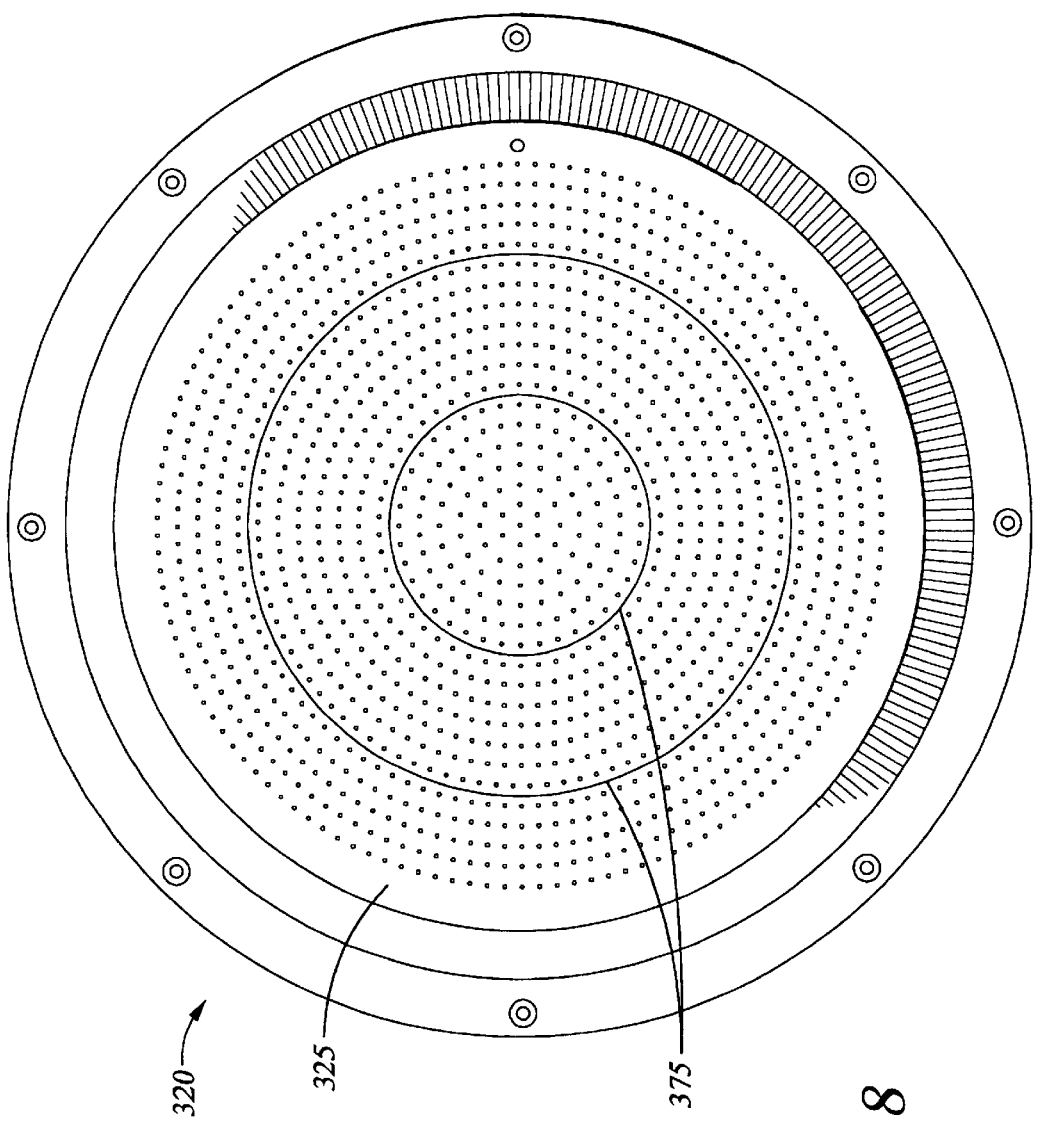
FIG. 8 is a bottom view of the embodiment of FIG. 7 illustrating positioning of two concentric resistive heating elements disposed on the gas distribution plate.

Referring to FIGS. 7 and 8, the thermal gradient may also be controlled by altering the configuration of the resistive heating elements to provide specific heating regions. For example, to create a concentric temperature gradient, the resistive heating elements are disposed in concentric rings across the faceplate 325 of the gas distribution plate 375 and in the chamber lid 300 with a concentric thermal fluid passage 373 positioned radially outward from the resistive heating elements 375.

Varying the power levels supplied to configurations with more than one resistive heating element 375 can provide further control of the thermal gradient. Power can be supplied at different levels to individual resistive heating elements 375, such as individual resistive heating elements in a concentric ring configuration, thereby allowing different temperature levels at each concentric ring resistive heating element. Selecting a second temperature of the thermal fluid supply to the concentric thermal fluid passage 373 in conjunction with the described heating elements 373 can provide precise and controllable temperature across the gas distribution plate and subsequently the substrate disposed thereof.

Referring to FIGS. 6 and 7, control of the resistive heating elements 375 is achieved by a temperature controller 370 capable of adjusting the temperature of the resistive heating elements 375. The temperature controller 370 further controls the flow rates and temperatures of any cooling and heating fluids to control the temperature of thermal fluid passages 373, thereby controlling the temperature of the chamber lid 300 and the gas distribution plate 320. A plurality of temperature sensors or thermocouples 372 are selectively positioned on the chamber lid 300 and the gas distribution plate 320 to provide temperature readings to the controller 370.

The controller 370 determines whether the measured temperatures are within an acceptable deviation from the desired process temperature ($T_o$). If the measured temperatures are within the acceptable deviations, the controller 370 maintains the same power level to the resistive heating elements 375 or the same thermal fluid flow from the cooling fluid and the heating fluid.

If the measured temperatures are outside of the acceptable deviations, the controller 70 changes the temperature of the thermal fluid by varying the power level of the resistive heating elements 375 or varying the proportional amount of any cooling and heating fluid to either cool or heat the chamber lid 300 and the gas distribution plate 320. Preferably, the temperature of the gas distribution plate 320 is continuously monitored to provide instantaneous feedback of temperature changes so that the controller 370 can instantly change the temperature of the thermal fluid accordingly. Alternatively, the temperature can be monitored periodically in short intervals.

Figure 9:
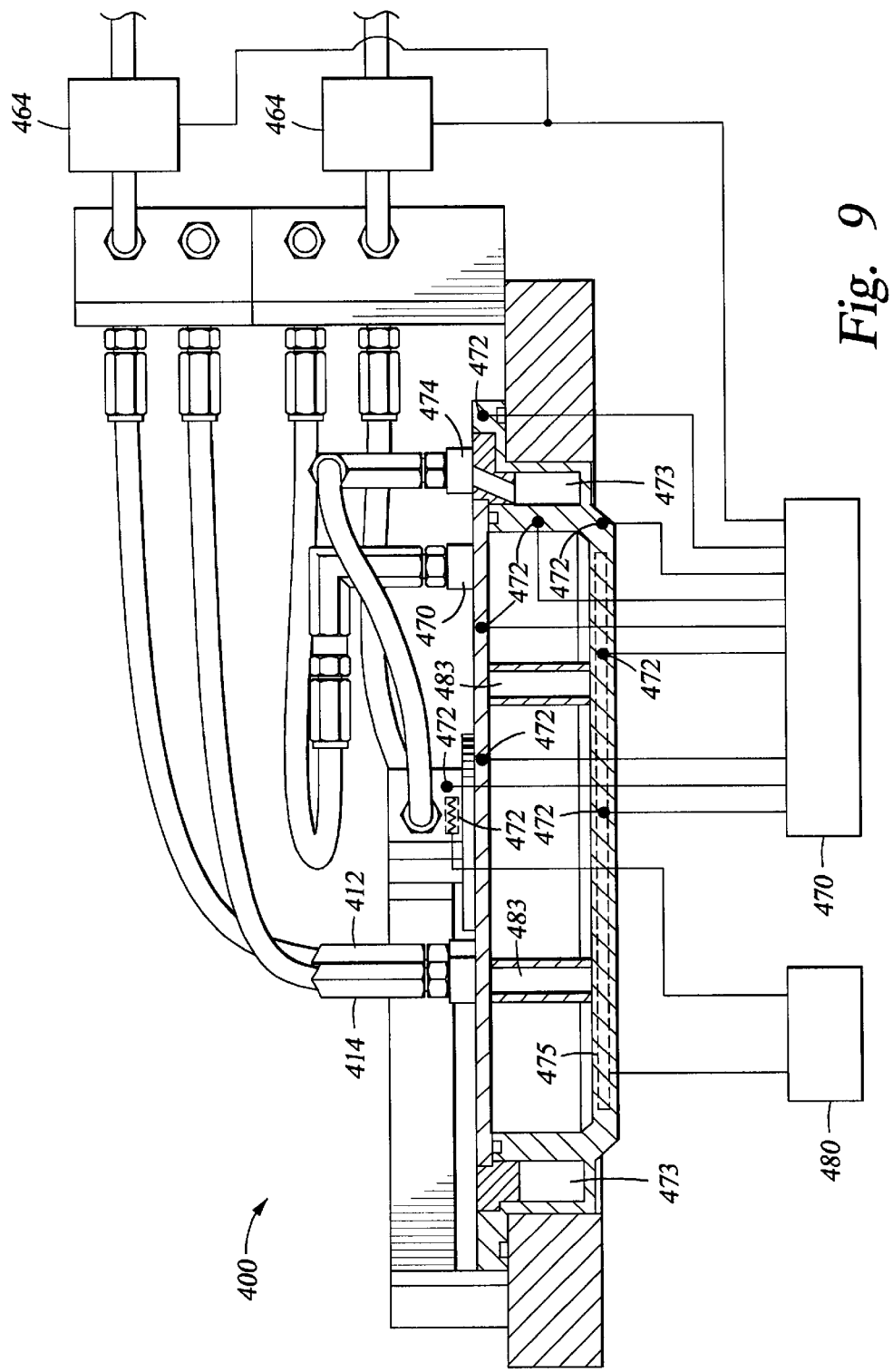
FIG. 9 is a cross sectional view of an alternative embodiment of the invention having two concentric thermal fluid passages and more than one concentric resistive heating elements disposed in the chamber lid.

FIG. 9 is a cross sectional view of another embodiment of the invention that includes two thermal fluid passages 473, 483 disposed concentrically within the chamber lid 400 with at least one resistive heating element 475. Two thermal fluid passages 473, 483 are disposed within the chamber lid 400 to provide more accurate substrate temperature control. The thermal fluid passages 473, 483 are preferably arranged concentrically to correspond to the temperature variations on the substrate.

Control of the temperatures of the respective thermal fluid passages is performed as described above for the embodiment described in FIG. 5, where fluid from one or more thermal fluid supplies (not shown), regulated by control valves 464, enter the thermal fluid passages 473, 483 through inlets 412, 470, circulates through the thermal fluid passages 473, 483, and exits through respective outlets 414, 474.

Generally, the temperatures of the thermal fluids in outer thermal fluid passage 473 are higher than the temperatures of the thermal fluids for inner thermal fluid passage 483 to equalize the temperatures across the substrate. However, fluid temperatures may vary depending on the configuration and respective power levels of the adjacent resistive heating elements. Using different temperatures for the thermal fluids in the thermal fluid passages 473 and 483 can create a temperature gradient concentrically in the chamber lid 400.

One or more resistive heating elements 475 positioned across the face 425 of the gas distribution plate 420 may be used with thermal fluid passages 473, 483 to control the temperature of the gas distribution plate 420 and chamber lid 400. The resistive heating elements 475 are in thermal communication with the gas distribution plate 420, such as either embedded within or fastened to the gas distribution plate 420 and chamber lid 400. The resistive heating elements may be configured as concentric arrays, grid patterns, individual concentric lines, or a number of various configuration for heating of the gas distribution plate 420. Each resistive heating element is independently connected and powered by a power supply 480. The power supply 480 delivers a controllable power level to the resistive heating elements which produces controllable temperatures.

Figure 10:
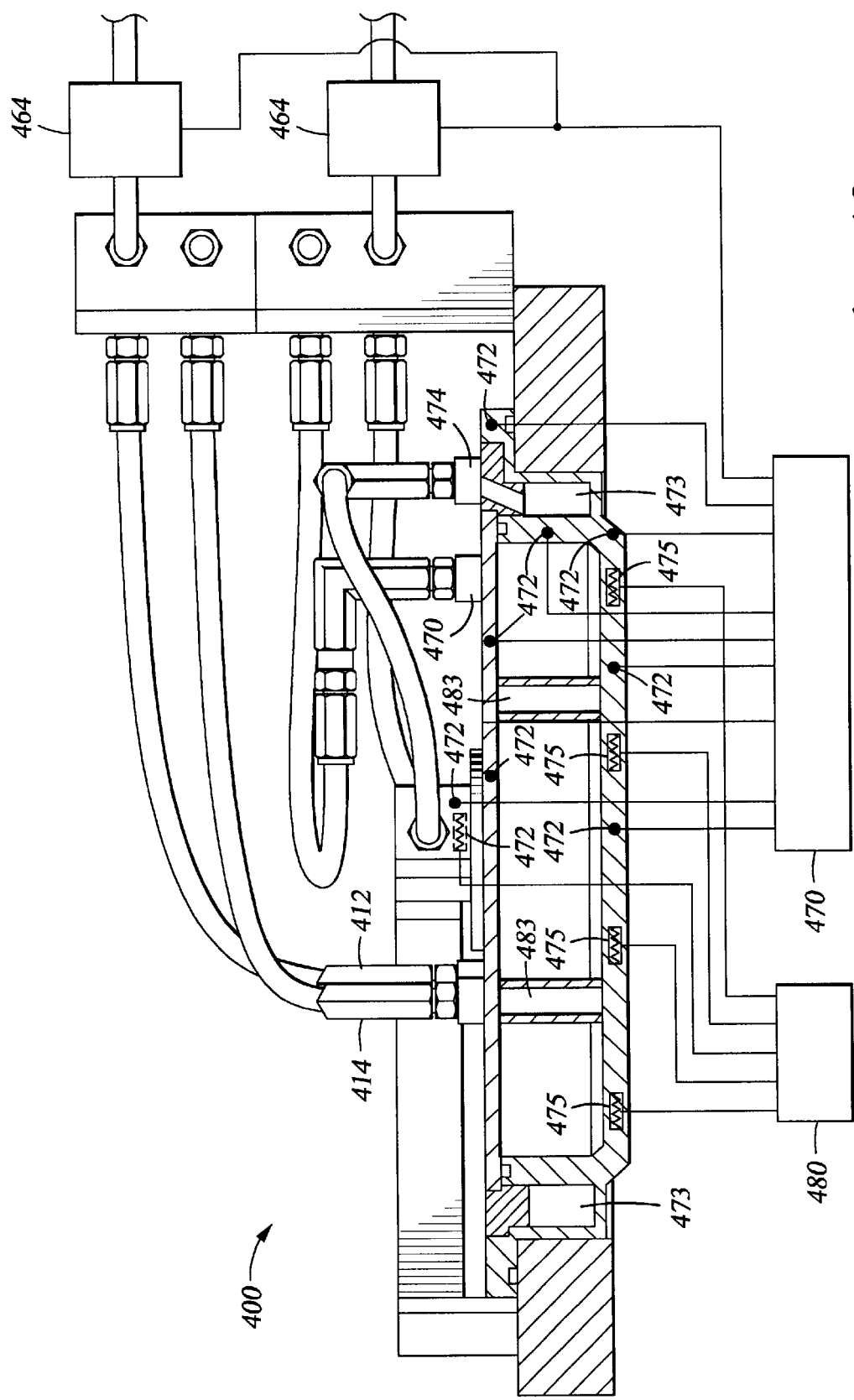
FIG. 10 is a cross sectional view of an alternative embodiment of the invention having two concentric thermal fluid passages and two concentric resistive heating elements disposed on the gas distribution plate.

Referring to FIG. 10, the thermal fluid passages 473, 483 may be disposed in an alternating sequence with one or more concentrically disposed resistive heating elements 475 to further enhance temperature control. Alternatively, one or more resistive heating elements 475 may be disposed between the thermal fluid passages or are disposed in various configurations as described above to improve temperature control. The resistive heating elements 475 are independently connected and controlled by power supply 480 as described above for the embodiments described in FIGS. 6 and 7.

A plurality of temperature sensors or thermocouples 472 are selectively positioned on the chamber lid 400 and the gas distribution plate 420 to provide temperature readings to the controller 470 to adjust the temperature of the resistive heating elements 475 and any cooling and heating fluids to control the temperature of the chamber lid 400 and the gas distribution plate 420.

Alternatively, radiative heater may be used to provide temperature control to a component in a system. It is contemplated that the radiative heater can comprise an infrared heater, such as an infrared lamp. The radiative heating element can comprise multiple infrared lamps to provide the desired heating. The multiple infrared lamps may be configured into an array of lamps, such as a concentric array of lamps for use in maintaining and establishing a thermal gradient on the chamber lid or gas distribution plate.

The radiative heating element is preferably position outside the processing chamber but in thermal communication with the showerhead 120 by the use of a chamber lid (not shown) of a transparent material such as quartz. Infrared heaters can emit rays which are then directly or indirectly, such as with a reflector, coupled into the processing chamber via the chamber lid to provide heating to the showerhead 120.

The radiative heating element is preferably used with an additional thermal conductor, such as the thermal fluid passages described above in FIGS. 2–5, a controller connected to the radiative heater and additional thermal conductors to regulate heat transfer between the component and the radiative heater and additional thermal conductors, and at least one temperature sensor connected to the component to supply temperature readings to the controller.

Although the described embodiments utilizes thermal fluid through thermal conductivity, resistive heating and cooling elements, and radiative heating elements, to control the temperature of the chamber lid 100, including the gas distribution plate 120 and the gas injection manifold head 16, other forms of heating and cooling that can be disposed, adjacent the chamber or on or within the lid components, including other resistive and radiative elements as well as convective and/or electrical heating/cooling are contemplated by the invention. Furthermore, the invention is applicable to other substrate processing chambers and other components that require active temperature regulation. For example, in a PVD chamber, one or more thermal conductors can be attached to the base plate of a PVD target to actively regulate the temperature of the PVD target. Additionally, although the described embodiment applies generally to round substrates, the invention is adaptable to accommodate various shapes of substrates, e.g., rectangular substrates for flat panel displays and square substrates for magnetic heads.

While the foregoing is directed to the preferred embodiment of the present invention, other and further embodiments of the invention may be devised without departing from the basic scope thereof. The scope of the invention is determined by the claims which follow.

What is claimed is:

1. An apparatus for regulating temperature of a gas distribution plate of a processing chamber, comprising:
    a) a first thermal conductor thermally connected to gas distribution plate, wherein the first thermal conductor is a resistive heating element disposed adjacent the gas distribution plate;
    b) a second thermal conductor thermally connected to the gas distribution plate, wherein the second thermal conductor is a fluid channel disposed adjacent the gas distribution plate, the fluid channel having a fluid inlet and a fluid outlet;
    c) a controller connected to the first and second thermal conductors to regulate heat transfer between the gas distribution plate and the first and second thermal conductors; and
    d) at least one temperature sensor connected to the gas distribution plate to supply temperature readings to the controller.

2. The apparatus of claim 1, wherein the resistive heating element is disposed as a concentric line, a concentric array, a grid pattern, or combinations thereof.

3. The apparatus of claim 1, wherein the controller regulates power supplied to the first thermal conductor.

4. The apparatus of claim 3, wherein a power level between about 5 watts and about 2000 watts is supplied to the first thermal conductor.

5. The apparatus of claim 1, further comprising a cooling fluid supply and a heating fluid supply connected to the fluid inlet and regulated by the controller.

6. The apparatus of claim 1, wherein the controller regulates proportionately the cooling fluid supply and the heating fluid supply into the fluid inlet.

7. The apparatus of claim 1, wherein the controller provides independent on/off regulation of the cooling fluid supply and the heating fluid supply.

8. The apparatus of claim 1, further comprising a constant fluid supply connected to the fluid inlet, the constant fluid supply providing a constant flow of a fluid maintained at a designated temperature.

9. The apparatus of claim 1, wherein the first and second thermal conductors are disposed concentrically.

10. The apparatus of claim 1, wherein the first thermal conductor is disposed above a peripheral portion of a substrate in a chamber and the second thermal conductor is disposed over a central portion of the substrate in the chamber.

11. A method of regulating temperature of a gas distribution plate of a processing chamber, comprising:
    a) providing a first thermal conductor thermally connected to the gas distribution plate, wherein the first thermal conductor is a resistive heating element disposed adjacent the gas distribution plate;
    b) providing a second thermal conductor thermally connected to the gas distribution plate, wherein the second thermal conductor is a fluid channel disposed adjacent the gas distribution plate, the fluid channel having a fluid inlet and a fluid outlet;
    c) providing a controller connected to the first and second thermal conductor;
    d) providing at least one temperature sensor connected to the gas distribution plate to supply temperature readings to the controller; and
    e) regulating heat transfer between the gas distribution plate and the first and second thermal conductor by changing the temperatures of the first and second thermal conductors.

12. The method of claim 11, wherein the temperature of the second thermal conductor is higher than the temperature of the first thermal conductor.

13. The method of claim 11, wherein the resistive heating element is provided as a concentric line, a concentric array, a grid pattern, or combinations thereof.

14. The method of claim 11, wherein the controller regulates power supplied to the first thermal conductor and wherein changing the temperature of the first thermal conductor comprises changing the power supplied to the first thermal conductor.

15. The method of claim 11, further comprising providing a cooling fluid supply and a heating fluid supply connected to the fluid inlet of the second thermal conductor.

16. The method of claim 15, wherein the controller regulates proportionately the cooling fluid supply and the heating fluid; supply into the fluid inlet and wherein changing the temperature of the second thermal conductor comprises changing the proportion of the cooling fluid supply and the heating fluid supply into the fluid inlet.

17. The method of claim 15, wherein the controller provides independent on/off regulation of the cooling fluid supply and the heating fluid supply and wherein changing the temperature of the second thermal conductor comprises independently switching on and off the cooling fluid supply and the heating fluid supply into the fluid inlet.

18. The method of claim 15, further comprising a constant fluid supply connected to the fluid inlet, the constant fluid supply providing a constant flow of a fluid maintained at a designated temperature; and wherein changing the temperature of the second thermal conductor comprises independently switching on and off the cooling fluid supply and the heating fluid supply into the fluid inlet.

19. An apparatus for regulating temperature of a gas distribution plate of a processing chamber, comprising:
    a) at least one first thermal conductor in thermal communication with the gas distribution plate, wherein the first thermal conductor is a radiative heating element disposed adjacent the gas distribution plate;
    b) at least one second thermal conductor attached to the gas distribution plate, a second thermal conductor thermally connected to the gas distribution plate, wherein the second thermal conductor is a fluid channel disposed adjacent the gas distribution plate, the fluid channel having a fluid inlet and a fluid outlet;

c) a controller connected to the first and second thermal conductors to regulate heat transfer between the gas distribution plate and the first and second thermal conductors;

d) at least one temperature sensor connected to the gas distribution plate to supply temperature readings to the controller; and e) a cooling fluid supply and a heating fluid supply connected to the fluid inlet and regulated by the controller, wherein the controller regulates proportionately the cooling fluid supply and the heating fluid supply into the fluid inlet.

20. The apparatus of claim 19, wherein the radiative heating element comprises an infrared heater.

21. The apparatus of claim 20, wherein the radiative heating element comprises an array of infrared heating units.

22. The apparatus of claim 21, wherein the radiative heating element comprises an array of concentrically disposed infrared heating units.

23. The apparatus of claim 19, wherein the controller provides independent on/off regulation of the cooling fluid supply and the heating fluid supply.

24. The apparatus of claim 19, further comprising a constant fluid supply connected to the fluid inlet, the constant fluid supply providing a constant flow of a fluid maintained at a designated temperature.

25. A method for regulating a temperature of a processing gas introduced into a processing chamber, comprising:

positioning a gas distribution plate in a processing chamber, the gas distribution plate in fluid communication with a source of processing gas;

flowing the processing gas through the gas distribution plate, the gas distribution plate comprising:
  a first thermal conductor thermally connected to the gas distribution plate, wherein the first thermal conductor is a resistive heating element disposed adjacent the gas distribution plate;
  a second thermal conductor thermally connected to the gas distribution plate, wherein the second thermal conductor is a fluid channel disposed adjacent the gas distribution plate, the fluid channel having a fluid inlet and a fluid outlet;

a controller connected to the first and second thermal conductors;

at least one temperature sensor connected to the gas distribution plate to supply temperature readings to the controller; and controlling the temperature of the processing gas by changing the temperatures of the first and second thermal conductors.

26. The method of claim 25, wherein the temperature of the second thermal conductor is higher than the temperature of the first thermal conductor.

27. The method of claim 25, wherein the resistive heating element is provided as a concentric line, a concentric array, a grid pattern, or combinations thereof.

28. The method of claim 25, wherein the controller regulates power supplied to the first thermal conductor and wherein changing the temperature of the first thermal conductor comprises changing the power supplied to the first thermal conductor.

29. The method of claim 25, further comprising providing a cooling fluid supply and a heating fluid supply connected to the fluid inlet of the second thermal conductor.

30. The method of claim 29, wherein the controller regulates proportionately the cooling fluid supply and the heating fluid supply into the fluid inlet and wherein changing the temperature of the second thermal conductor comprises changing the proportion of the cooling fluid supply and the heating fluid supply into the fluid inlet.

31. The method of claim 29, wherein the controller provides independent on/off regulation of the cooling fluid supply and the heating fluid supply and wherein changing the temperature of the second thermal conductor comprises independently switching on and off the cooling fluid supply and the heating fluid supply into the fluid inlet.

32. The method of claim 29, further comprising a constant fluid supply connected to the fluid inlet, the constant fluid supply providing a constant flow of a fluid maintained at a designated temperature; and wherein changing the temperature of the second thermal conductor comprises independently switching on and off the cooling fluid supply and the heating fluid supply into the fluid inlet.

* * * * *

UNITED STATES PATENT AND TRADEMARK OFFICE
CERTIFICATE OF CORRECTION

PATENT NO. : 6,433,314 B1
DATED : August 13, 2002
INVENTOR(S) : Mandrekar et al.

It is certified that error appears in the above-identified patent and that said Letters Patent is hereby corrected as shown below:

<u>Title page,</u>
Item [63], please change "09/052,254" to -- 09/057,254 --.

<u>Column 13,</u>
Line 26, please change "to gas" to -- to the gas --.

Signed and Sealed this

Nineteenth Day of August, 2003

JAMES E. ROGAN
*Director of the United States Patent and Trademark Office*